US012580497B2

(12) United States Patent
Wang et al.

(10) Patent No.: US 12,580,497 B2

(45) Date of Patent: Mar. 17, 2026

(54) PREDICTION METHOD FOR CROSSTALK SPIKE IN HALF-BRIDGE OF CURRENT SOURCE TYPE INVERTER WITH SILICON CARBIDE DEVICES

(71) Applicant: SOUTHEAST UNIVERSITY, Nanjing (CN)

(72) Inventors: Zheng Wang, Nanjing (CN); Yinzhen Shen, Nanjing (CN); Yang Xu, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 260 days.

(21) Appl. No.: 18/553,966

(22) PCT Filed: Nov. 24, 2022

(86) PCT No.: PCT/CN2022/133851

§ 371 (c)(1),
(2) Date: Oct. 4, 2023

(87) PCT Pub. No.: WO2024/060393

PCT Pub. Date: Mar. 28, 2024

(65) Prior Publication Data

US 2025/0076349 A1 Mar. 6, 2025

(30) Foreign Application Priority Data

Sep. 19, 2022 (CN) .......................... 202211138910.7

(51) Int. Cl.
H02M 7/5387 (2007.01)
G01R 19/04 (2006.01)
(Continued)

(52) U.S. Cl.
CPC ..... H02M 7/53871 (2013.01); H02M 1/0038 (2021.05); H02M 1/44 (2013.01);
(Continued)

(58) Field of Classification Search
CPC .............. H02M 7/537; H02M 7/5387; H02M 7/53871; H02M 1/0038; H02M 1/08; H02M 1/44; G01R 19/04
See application file for complete search history.

(56) References Cited

U.S. PATENT DOCUMENTS

| | | | |
|---|---|---|---|
| 2021/0021258 A1* | 1/2021 | Wang | H03K 17/166 |
| 2022/0311353 A1* | 9/2022 | Qiao | H02M 1/44 |

FOREIGN PATENT DOCUMENTS

| | | | | |
|---|---|---|---|---|
| CN | 107342756 A | * | 11/2017 | H03K 17/687 |
| CN | 111464005 A | * | 7/2020 | H02M 1/088 |

(Continued)

OTHER PUBLICATIONS

Machine Translation CN 107342756 (Year: 2017).*

(Continued)

*Primary Examiner* — Steven L Yeninas

(74) *Attorney, Agent, or Firm* — MUNCY, GEISSLER, OLDS & LOWE, P.C.

(57) ABSTRACT

A prediction method for a crosstalk voltage spike in a half bridge of current-source inverter with silicon carbide devices includes calculation of the crosstalk voltage spike in the circuit of current-source type double-pulse test and analysis of the effect of each parameter on the magnitude of the crosstalk voltage spike. The prediction method analyzes the horizontal conduction crosstalk mechanism between the gate-source junction of the MOSFET caused by the high-frequency switching action of the silicon carbide (SiC) MOSFET and the SiC Schottky diode connected in series, and derives the prediction model. Based on the equivalent circuit of the current-source-type double-pulse test and the crosstalk-induced mechanism, the extreme value of cross-talk voltage spike is accurately predicted, which is helpful to analyze the effects of the drive circuit and the parameters of the power circuit on the crosstalk voltage spike through the prediction model.

6 Claims, 21 Drawing Sheets

(51) Int. Cl.
  *H02M 1/00* (2007.01)
  *H02M 1/44* (2007.01)
  *H02M 7/537* (2006.01)

(52) U.S. Cl.
  CPC ............. *H02M 7/537* (2013.01); *G01R 19/04*
  (2013.01); *H02M 7/5387* (2013.01)

(56) References Cited

FOREIGN PATENT DOCUMENTS

| | | | | | |
|---|---|---|---|---|---|
| CN | 112491253 A | | 3/2021 | | |
| CN | 112953174 A | * | 6/2021 | ............. | H02M 1/08 |
| CN | 113076712 A | | 7/2021 | | |
| CN | 114362491 A | | 4/2022 | | |
| CN | 110212740 B | * | 8/2022 | ........... | H02M 1/092 |
| JP | 2009-026298 A | | 2/2009 | | |

OTHER PUBLICATIONS

Machine Translation CN 110212740 (Year: 2022).*
Machine Translation CN 111464005 (Year: 2020).*
Machine Translation CN 112953174 (Year: 2021).*
Xiong, Qiaopo et al., "Crosstalk Analysis and Suppression of Silicon Carbide MOSFET based Three-level Neutral-Point-Clamped Inverter," 2021 IEEE 2nd China International Youth Conference on Electrical Engineering, Jan. 20, 2022, 6 pages.

* cited by examiner

1

PREDICTION METHOD FOR CROSSTALK SPIKE IN HALF-BRIDGE OF CURRENT SOURCE TYPE INVERTER WITH SILICON CARBIDE DEVICES

TECHNICAL FIELD

The present invention relates to the field of power electronics and electro technology. In particular, it is a prediction method for the crosstalk voltage spike in a half-bridge of current-source inverter with Silicon Carbide devices.

BACKGROUND

In recent years, with the rapid development of electric vehicles, wind power generation, multi-electric aircraft, etc., higher requirements have been put on the operating efficiency, power density and reliability of power converters. On the other hand, the manufacturing technology for wide-band-gap devices becomes mature, which is represented by Silicon Carbide (SiC) and Gallium Nitride (GaN). Compared with Silicon-based devices, the wide-band-gap devices have many advantages such as faster switching speed, lower switching loss, higher switching frequency, etc. These advantages are constantly being exploited, making it possible for the power converter to further develop towards higher operating efficiency and higher power density.

However, when the wide-band-gap devices are directly applied to a normal two-level voltage-source inverter, the fast switching speed of the devices will lead to the dv/dt and di/dt too large, resulting in the problems such as electromagnetic interference and the crosstalk in the half-bridge. For the problem of electromagnetic interference, the current technical means to mitigate the problem in power circuits mainly revolve around the design of filters, the application of soft-switching technology, and the optimization of circuit topology. Moreover, for the problem of the crosstalk in the half-bridge, the main focus is on the optimized design of the gate driver for wide-band-gap devices at present.

In addition, the operation space of the inverters is limited in many application occasions at present. Normal voltage-source inverters still have problems that the size of electrolytic capacitors on DC side is large and the operating temperature is limited. Therefore, some domestic and foreign scholars have turned their attention to current-source inverters in recent years. Compared with the voltage-source inverter, the current-source inverter has the advantages that the anti-short circuit capability is strong, the current reliability is high, and AC side output waveforms are friendly to the motor. However, the current-source inverter also has the problems that the size of the inductor on DC side is large and the dv dt on the DC side is relatively large.

Furthermore, it is well known that CSI is the dual of VSI. The output voltage of the voltage-source inverter is chopped waveforms. Therefore, dv dt caused by the device's switching in the inverter will couple with the gate-drain junction capacitance of the complementary device to cause the crosstalk problem in half-bridge. Similarly, the output current of the current-source inverter is chopped waveforms. Therefore, the di dt will become the main factor affecting the crosstalk in the half-bridge of current-source inverter. However, at present, researches on the crosstalk in half-bridge is still limited in the voltage-source inverter, and relevant crosstalk problem in half-bridge of the current-source inverter has not been studied.

On the other hand, the crosstalk caused by di dt in half-bridge of current-source inverter is usually coupled with common source inductance. Although at present, some discrete devices are packaged with Kelvin pins, such that the parasitic inductance on the source junction of the device is removed from the gate driver loop, which can effectively suppress the crosstalk caused by the di/dt. However, due to factors such as PCB routing and the pins of the discrete devices, it is difficult to make the common source inductance fall to zero. Therefore, it is still of great significance to conduct research on the crosstalk in half-bridge of current-source inverter.

SUMMARY

An object of the present invention is to provide a prediction method for the crosstalk voltage spike in the half-bridge of current-source inverter with silicon carbide devices. Through the mechanism analysis and crosstalk voltage spike prediction in the half-bridge of the current-source inverter, the crosstalk caused by the coupling of di dt and the common source inductance in the current-source inverter is studied, and a prediction model for the crosstalk voltage spike is proposed based on the theoretical analysis, which expands the optimization design criteria of the gate driver for the wide-band-gap devices-based current-source inverter.

The object of the present invention can be achieved by the following technical solution:

A prediction method for the crosstalk voltage spike in the half-bridge of current-source inverter with silicon carbide devices, which is characterized by including: calculation of the crosstalk voltage spike in the circuit of current-source type double-pulse test and analysis of the influence degree of each parameter on the magnitude of the crosstalk voltage spike.

In the circuit of the current-source type double-pulse test, two groups of reverse-voltage-blocking synthesis devices consisting of metal-oxide-semiconductor field effect transistors (MOSFET) and Schottky diodes in series are connected to both ends of a capacitor respectively. The capacitor is equivalent to a filter capacitor on the AC side of three-phase current-source inverter. This structure forms a half-bridge of the current-inverter, which is configured to simulate a switching sequence of the three-phase current-source inverter.

In the calculation of the crosstalk voltage spike, the maximum value of the calculated crosstalk voltage spike in the half-bridge of current-source inverter is:

$$\Delta V_{gs}(t) =$$

$$\begin{cases} \dfrac{I_0}{t} L_s \cdot \left[1 - e^{-\alpha t} \cdot \cos(\omega t) - \dfrac{\alpha}{\omega} \cdot e^{-\alpha t} \cdot \sin(\omega t)\right], & R_g^2 < \dfrac{4(L_s + L_g)}{C_{iss}} \\[3mm] \dfrac{I_0}{t} L_s \cdot (1 - e^{-\alpha t} - \alpha t e^{-\alpha t}), & R_g^2 = \dfrac{4(L_s + L_g)}{C_{iss}} \\[3mm] \dfrac{I_0}{t} L_s \cdot \left[1 - e^{-\alpha t} \cdot \cosh(\omega t) - \dfrac{\alpha}{\omega} \cdot e^{-\alpha t} \cdot \sinh(\omega t)\right], & R_g^2 > \dfrac{4(L_s + L_g)}{C_{iss}} \end{cases}$$

where t is the duration when the current rises and falls during the switching process, expressed as:

$$t = -\left(R_g C_{gs} + \dfrac{g_m}{x} L_s\right) ln\left(\dfrac{V_{miller} - V_{cc}}{V_{th} - V_{cc}}\right),$$

-continued $$\omega = \begin{cases} \sqrt{\dfrac{1}{C_{iss} \cdot (L_s + L_g)} - \dfrac{R_g^2}{4(L_s + L_g)^2}}, & R_g^2 < \dfrac{4(L_s + L_g)}{C_{iss}} \\ 0, & R_g^2 = \dfrac{4(L_s + L_g)}{C_{iss}} \\ \sqrt{\dfrac{R_g^2}{4(L_s + L_g)^2} - \dfrac{1}{C_{iss} \cdot (L_s + L_g)}}, & R_g^2 > \dfrac{4(L_s + L_g)}{C_{iss}} \end{cases}$$

$$\alpha = \frac{R_g}{2(L_g + L_s)},$$

$I_0$ is load current flowing through the device, $C_{gs}$ is the gate-source junction capacitance of the device affected by crosstalk, $g_m$ is the transconductance of the device, x is the fitting coefficient of the device's transfer characteristic curve $i_{ch}=k_1(V_{gs}-V_{th})^x+k_2$, $V_{th}$ is the threshold voltage, $V_{miller}$ is Miller plateau voltage, $V_{cc}$ is positive driving voltage, $R_g$ and $L_g$ are respectively the gate resistance and the stray inductance of the device's gate driver loop affected by crosstalk voltage in the equivalent circuit of the current-source type double-pulse test, $C_{iss}$ is the input capacitance of the device affected by crosstalk, which is the sum of gate-drain junction capacitance and gate-source junction capacitance, and $L_s$ is the sum of the internal common source inductance of the device affected by crosstalk and the stray inductance of PCB.

Among influencing factors for the crosstalk voltage spike, the size of the gate resistance, the size of the common source inductance and the size of series diode junction capacitance are main influencing factors. Specifically, when the di dt is constant, the smaller the gate resistance of the third switching transistor, the larger the crosstalk spike to which the device is subjected. The larger the common source inductance, the larger the crosstalk spike the third switching transistor in current-source type double-pulse test circuit bears. The larger the junction capacitance of the series diode, the greater the sudden change in the voltage across the diode in the third switching transistor, and the larger the reverse recovery current generated by coupling with the junction capacitance, making the reverse over-zero value of the current flowing through the third switching tube transistor larger and the reverse recovery process of the diode more obvious, which leads to the forward crosstalk spike endured by the third switching transistor larger.

Further, the circuit of the current-source type double-pulse test fully considers parasitic parameters and stray parameters in the device and the circuit, including the junction capacitance and stray inductance of the device and the stray inductance of the gate driver loop, where $R_{g1}$ and $R_{g3}$ are the sum of driver resistance and the gate internal resistance of the devices, $L_{d1}$ and $L_{d3}$ are the sum of parasitic inductance in the devices' drain junction and stray inductance of printed circuit board (PCB), and $L_{s1}$ and $L_{s3}$ are the sum of devices' common source parasitic inductance and the stray inductance of the PCB.

Further, the third switching transistor in the current-source type double-pulse test is always in the on-state, which is divided into two modes according to the turn-on and turn-off of the first switching transistor. When the first switching transistor is turned off, the current source charges the capacitor through the third switching transistor, simulating the active vector of three-phase current-source inverter. When the first switching transistor is turned on, current is switched from the third switching transistor to the first switching transistor, and the voltage on the capacitor is unchanged during this process, simulating the zero vector of three-phase current-source inverter.

The on-state of the third switching transistor simulates the overlapping conduction time of the three-phase current-source inverter during operation to avoid open-circuit fault.

Further, the crosstalk conducting direction in the half-bridge of the current-source inverter is horizontal, while the crosstalk conducting direction in half-bridge of the voltage-source inverter is vertical.

For the crosstalk in half-bridge of the current-source inverter, the complementary device bears forward crosstalk when the active switching transistor is turned on, and bears reverse crosstalk when the active switching transistor is turned off, which is opposite to the crosstalk in half-bridge also caused by di dt in the voltage-source inverter.

The crosstalk in half-bridge of the current-source inverter only occurs when the gate-source voltage of the device is at positive driving voltage. However, the crosstalk in half-bridge of the voltage-source inverter only occurs when the gate-source voltage of the device is at negative driving voltage.

Further, taking the di dt caused by the switching action of the first switching transistor as excitation, considering the overlapping conduction of the device, the MOSFET in the third switching transistor is equivalent as a resistor. The value of the resistor is the on-state resistance of the MOSFET, and a gate-drain junction capacitance is the value when the drain-source voltage is close to zero, without considering the effect of nonlinear change in different operating conditions of the device.

Further, the calculation of the Miller plateau voltage is corrected to $$V_{miller} = \frac{x(I_0 - k_2)}{g_m} + V_{th}$$

on the basis of the conventional calculation method.

The present invention has the following beneficial effects:

1. A current-source type double-pulse test circuit that considers parasitic parameters such as junction capacitance, parasitic inductance of the wide-band gap devices and the stray inductance of the power loop and the gate driver loop is used in the prediction method of the invention, which simplifies the topological structure of the three-phase current-source inverter, and implements the simulation of changing between the active vector and the zero vector. This facilitates the analysis of the switching trajectory of wide-band gap devices when used in current-source inverters, simplifying the analysis complexity while achieving optimal inverter design.

2. The prediction method of the present invention in current-source inverter forms a dual with the crosstalk in half-bridge of the conventional voltage-source inverter, which makes up for the gap in the crosstalk suppression research of different types of two-level power inverters.

3. The crosstalk voltage spike is accurately predicted by the prediction method of the present invention based on the parasitic parameters of the device and the loop, which is conducive to analyzing the influence of each parameter in the gate driver loop and power loop on the crosstalk voltage spike through the prediction model.

4. The prediction method of the present invention has guiding significance for the optimization design of the gate driver circuit in the current-source inverter and selection of the parameters of devices.

BRIEF DESCRIPTION OF THE DRAWINGS

The present invention is further described below in conjunction with the accompanying drawings.

FIG. 4 is a voltage waveform of the MOSFET in the first switching transistor when the first switching transistor is turned on;

FIG. 5 is a waveform of current flowing through the first switching transistor and the waveform of current flowing through the third switching transistor when the first switching transistor is turned on;

FIG. 6 is a voltage waveform on the Schottky diode in the third switching transistor when the first switching transistor is turned on;

FIG. 7 is the gate-source voltage waveforms of the MOSFETs in the first switching transistor and the third switching transistor when the first switching transistor is turned on;

FIG. 15 is a relationship diagram between the extreme value of the crosstalk spike in half-bridge of the current-source inverter and gate resistance when the first switching transistor is turned on;

FIG. 17 is a relationship diagram between the extreme value of the crosstalk spike in half-bridge of the current-source inverter, common source inductance, and stray inductance in driver loop when the first switching transistor is turned on;

DETAILED DESCRIPTION

The technical solutions in the embodiments of the present invention are clearly and completely described below with reference to the accompanying drawings in the embodiments of the present invention. Apparently, the described embodiments are some of the embodiments of the present invention rather than all of the embodiments. All other embodiments obtained by a person of ordinary skill in the art based on the embodiments of the present invention without creative efforts shall fall within the protection scope of the present invention.

As for a prediction method for the crosstalk voltage spike in half-bridge of current-source inverter with silicon carbide devices, it includes the calculation of the crosstalk voltage spike in the circuit of current-source type double-pulse test and analysis of the effect of each parameter on the magnitude of the crosstalk voltage spike.

Figure 1:
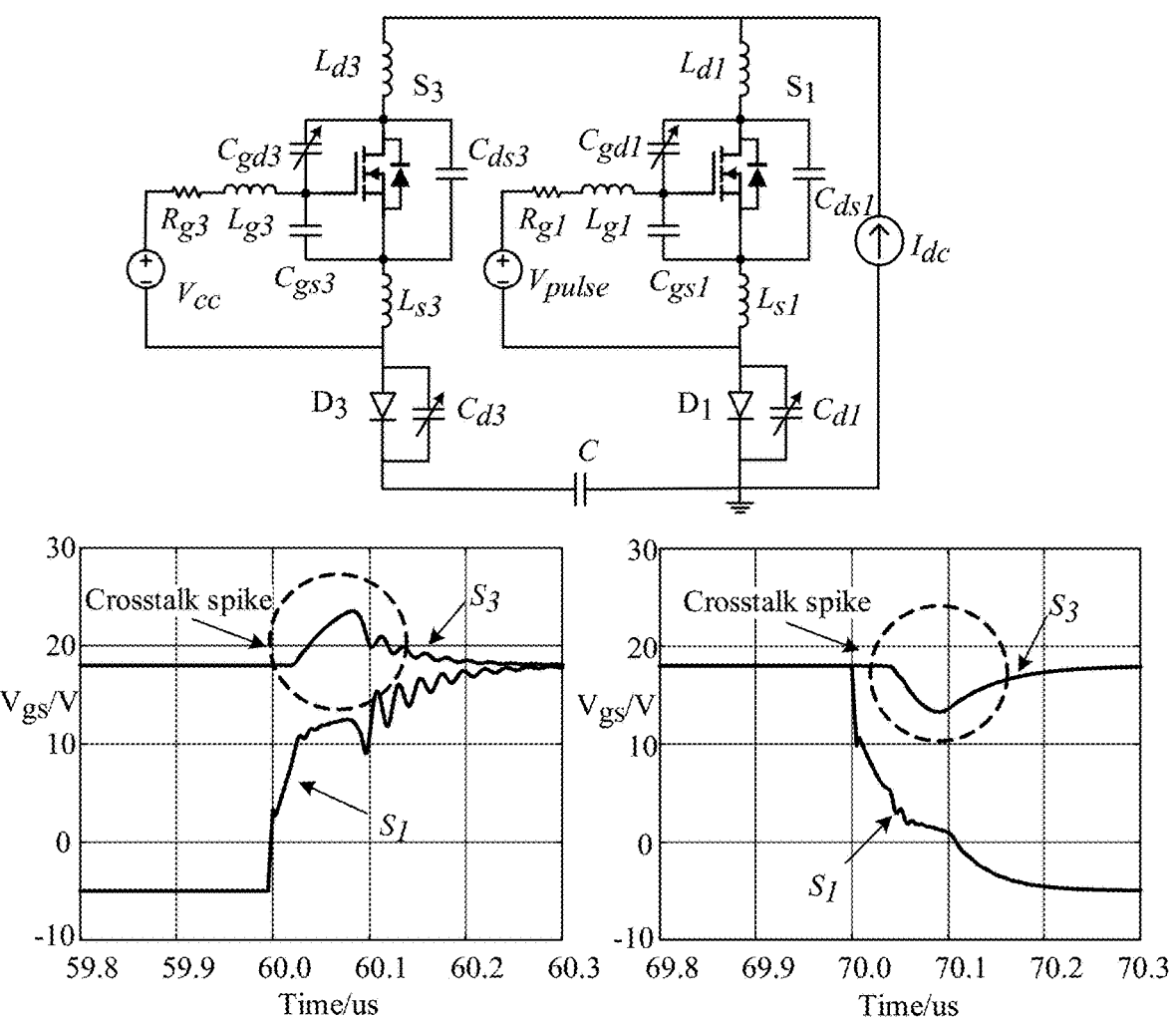
FIG. 1 is a circuit topology of a current-source type double-pulse test and a crosstalk phenomenon waveform diagram.
Figure 2:
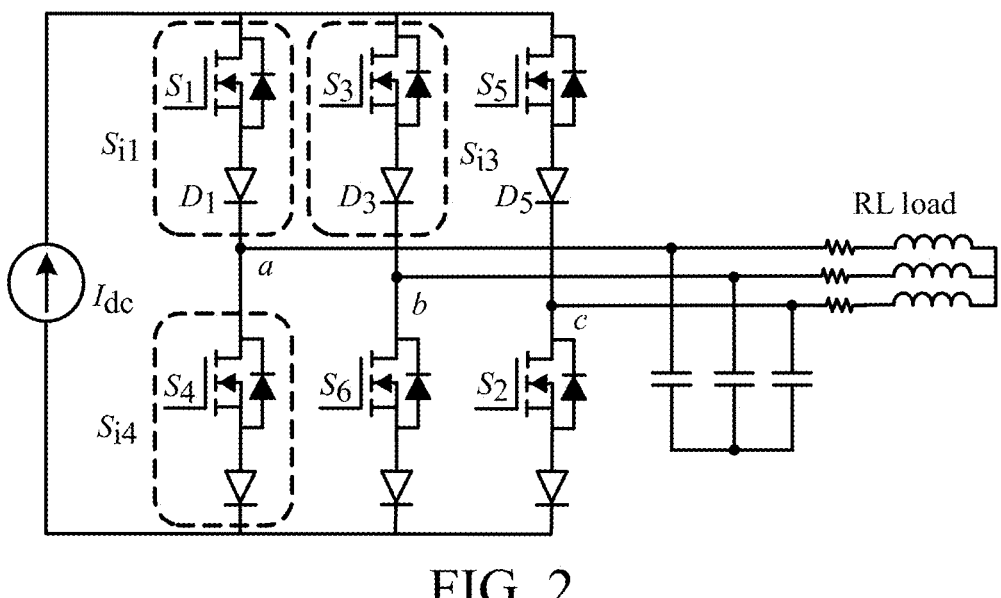
FIG. 2 is a topology diagram of conventional three-phase current-source inverter.

The prediction method is based on the current-source type double-pulse test as an analysis object. First, a half-bridge configuration is extracted from the three-phase current-source inverter, as shown in FIG. 2. According to the typical modulation strategy of three-phase current-source inverter, the three-phase current-source inverter has six active vectors and three zero vectors, which follow the characteristics of horizontal switching. The SiC MOSFET $S_1$ and the SiC Schottky diode $D_1$ in the figure constitute a reverse-voltage-blocking device $S_{i1}$, which is the first switching transistor, $S_3$ and $D_3$ constitute the third switching transistor $S_{i3}$, and $S_4$ and $D_4$ constitute the fourth switching transistor $S_{i4}$. Taking the first switching transistor $S_{i1}$ and the third switching transistor $S_{i3}$ as an example, if $S_{i1}$ and $S_{i3}$ are switched back and forth, the corresponding sector is the fifth sector in the three-phase current-source inverter. At this time, $S_{i4}$ is in a long-turn-on state. Therefore, the fourth switching can be equivalent to a segment of wire, and thus, $S_{i1}$ and $S_{i3}$ can be extracted as a half-bridge of the three-phase current-source inverter to obtain a circuit topology of current-source type double-pulse test, as shown in FIG. 1, the capacitor C is the equivalent of the filter capacitor on an AC side of the three-phase current-source inverter. The circuit of the current-source type double-pulse test in FIG. 1 fully considers parasitic parameters and stray parameters in the devices and the circuit loop, including the junction capacitance ($C_{d1}$, $C_{d3}$, $C_{gd1}$, $C_{gd3}$, $C_{cs1}$, $C_{gs3}$, $C_{ds1}$, $C_{ds3}$) and stray inductance of the devices and stray inductance of the drive loop ($L_{g1}$, $L_{g3}$), where $R_{g1}$ and $R_{g3}$ are the sum of drive resistance and the internal gate resistance of the devices, $L_{d1}$ and $L_{d3}$ are the sum of the drain parasitic inductance of the devices and stray inductance of PCB, and $L_{s1}$ and $L_{s3}$ are the sum of the common source parasitic inductance of the devices and the stray inductance of PCB.

Figure 3:
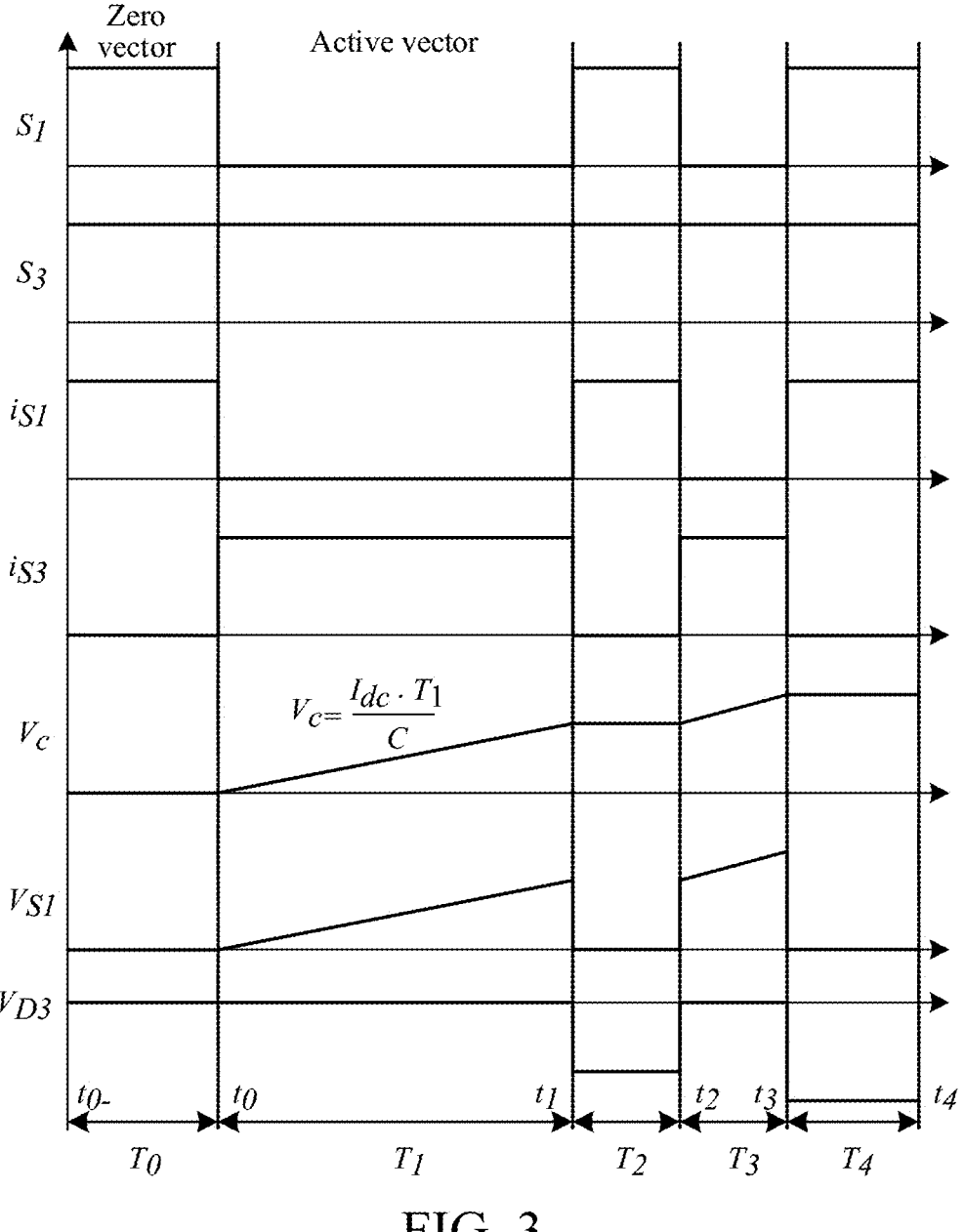
FIG. 3 is a theoretical working waveform diagram of a current-source type double-pulse test.
Figure 4:
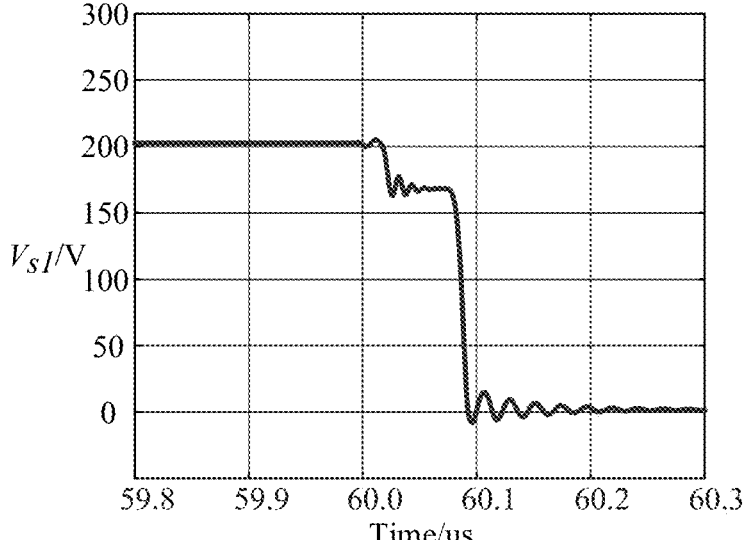
Figure 5:
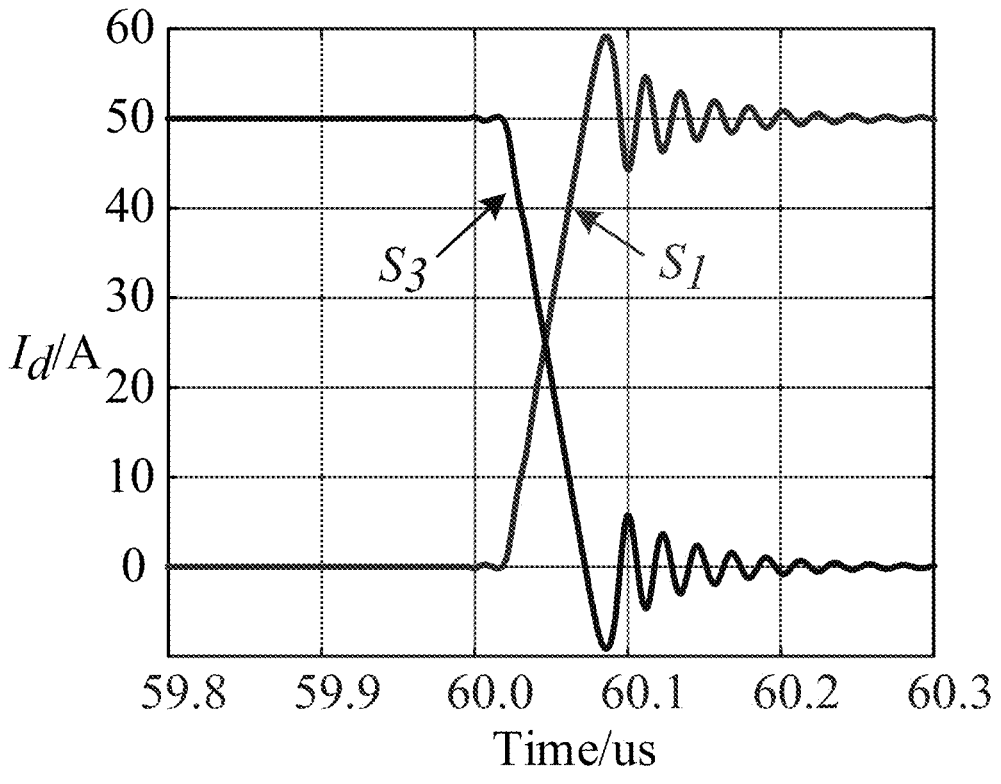
Figure 6:
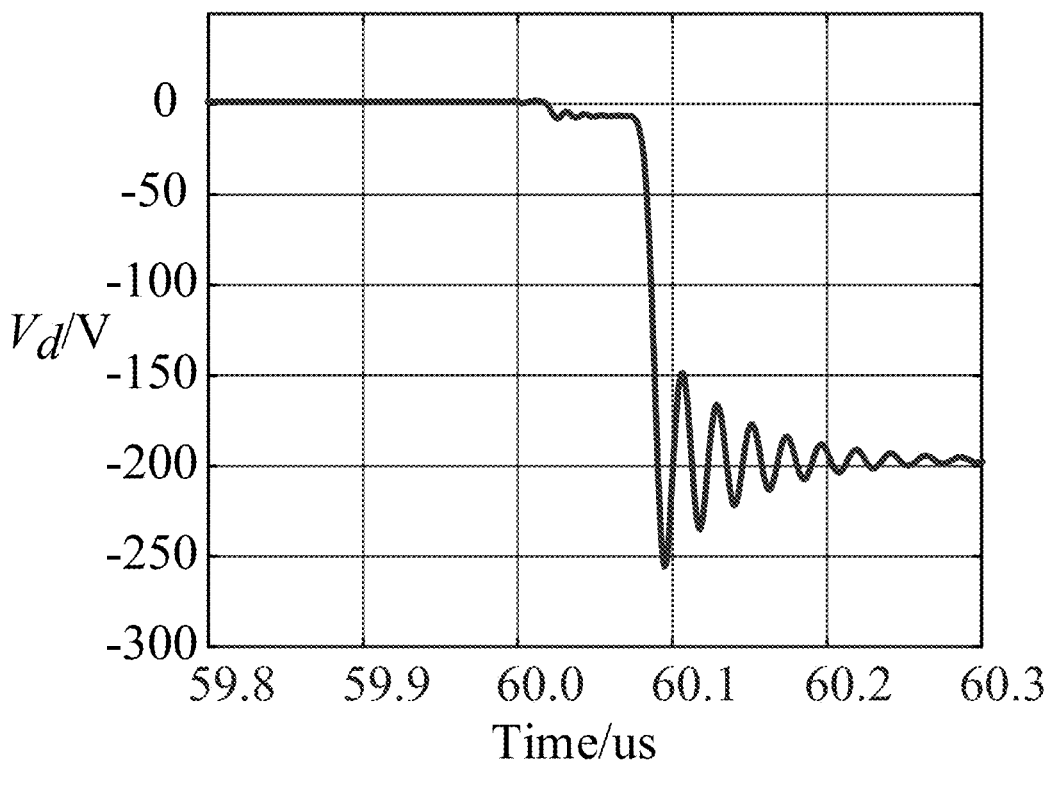
Figure 7:
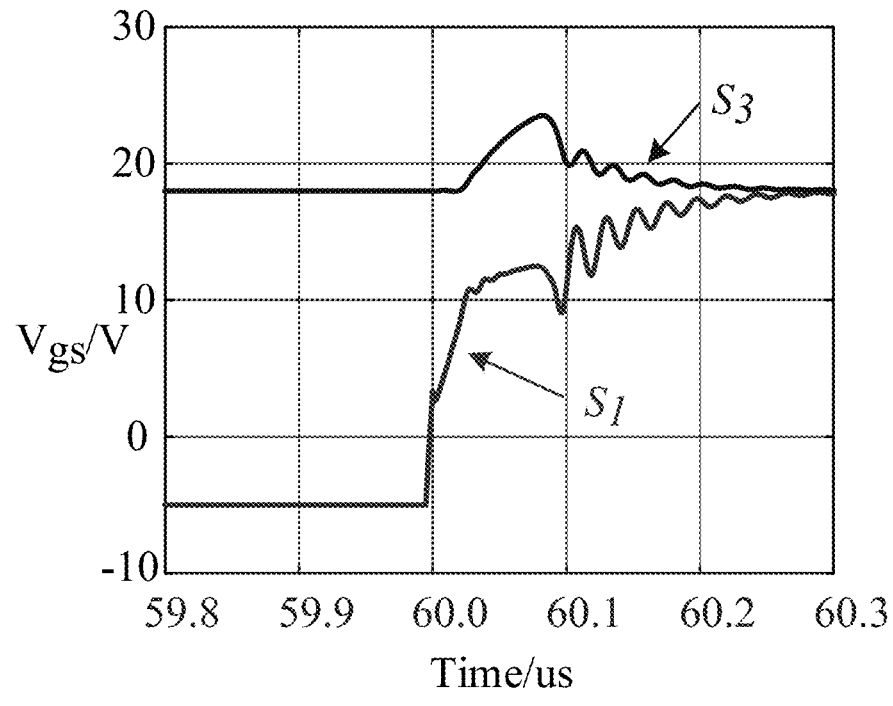
Figure 8:
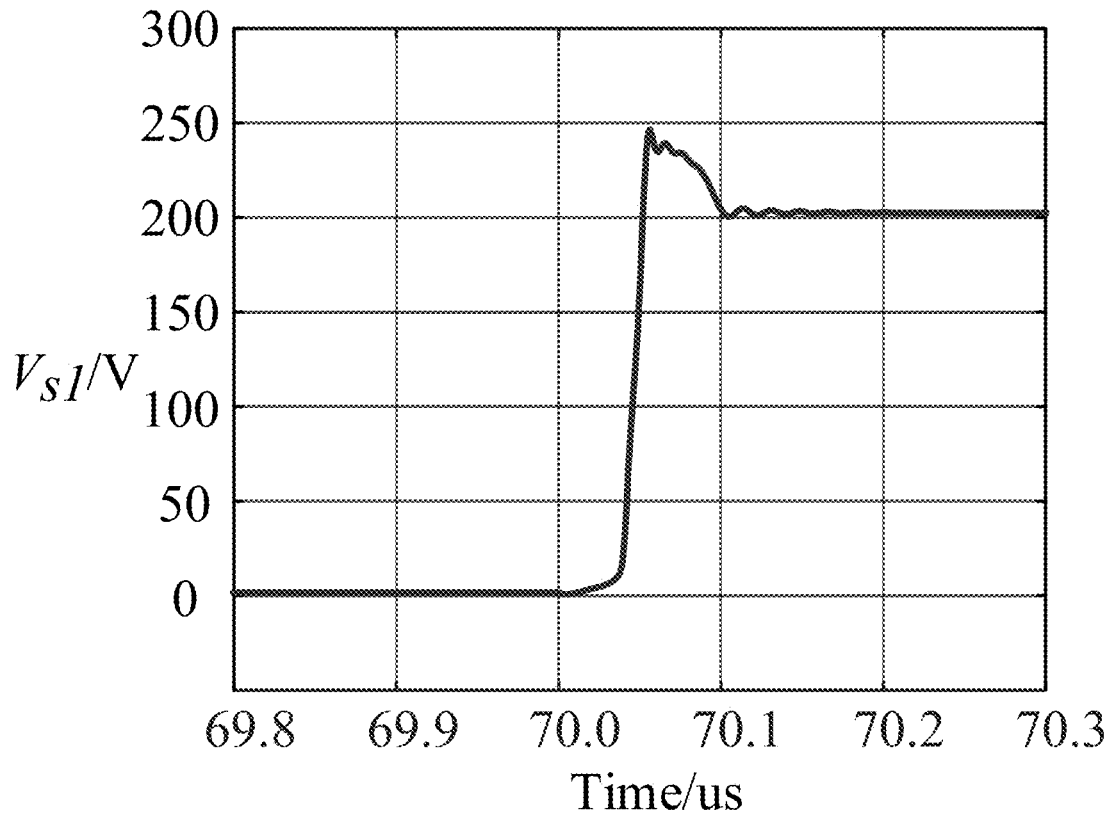
FIG. 8 is the drain-source voltage waveform of the MOSFET in the first switching transistor when the first switching transistor is turned off.
Figure 9:
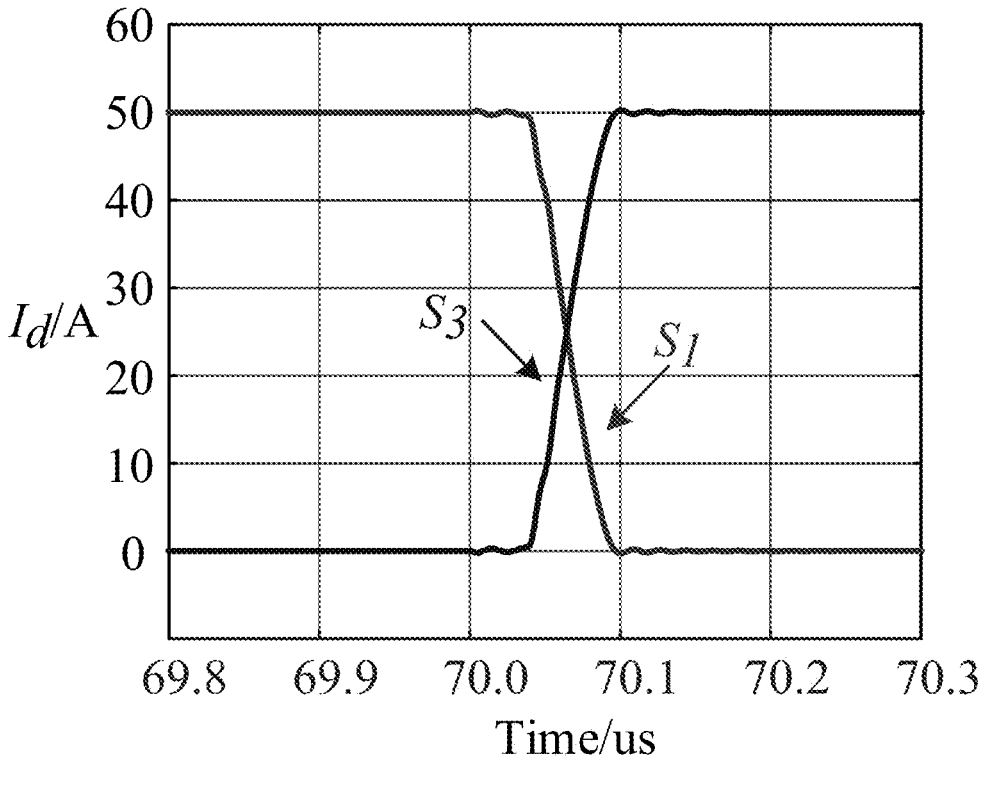
FIG. 9 is a waveform of current flowing through the first switching transistor and the waveform of current flowing through the third switching transistor when the first switching transistor is turned off.
Figure 10:
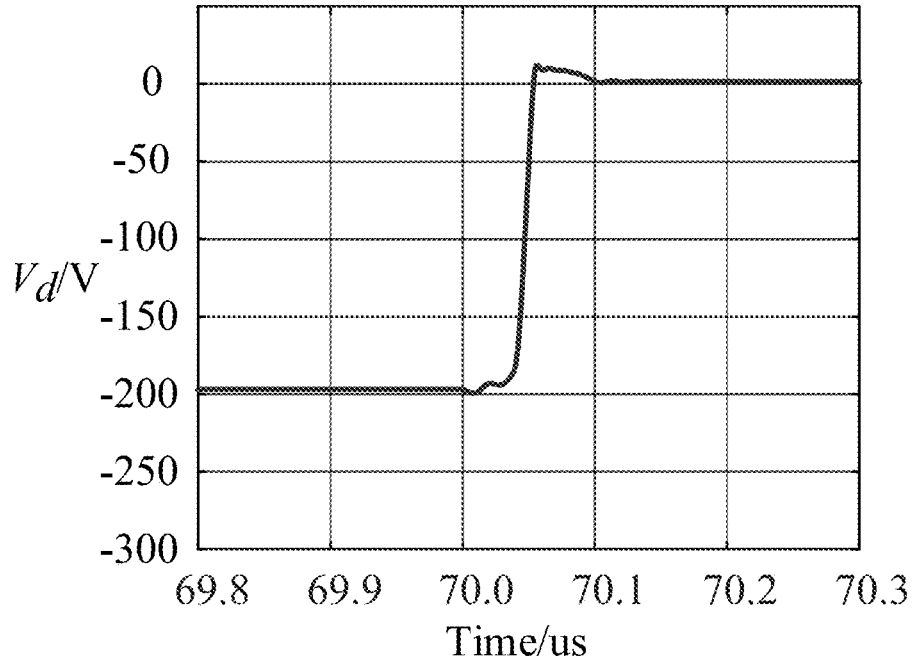
FIG. 10 is a voltage waveform of the Schottky diode in the third switching transistor when the first switching transistor is turned off.
Figure 11:
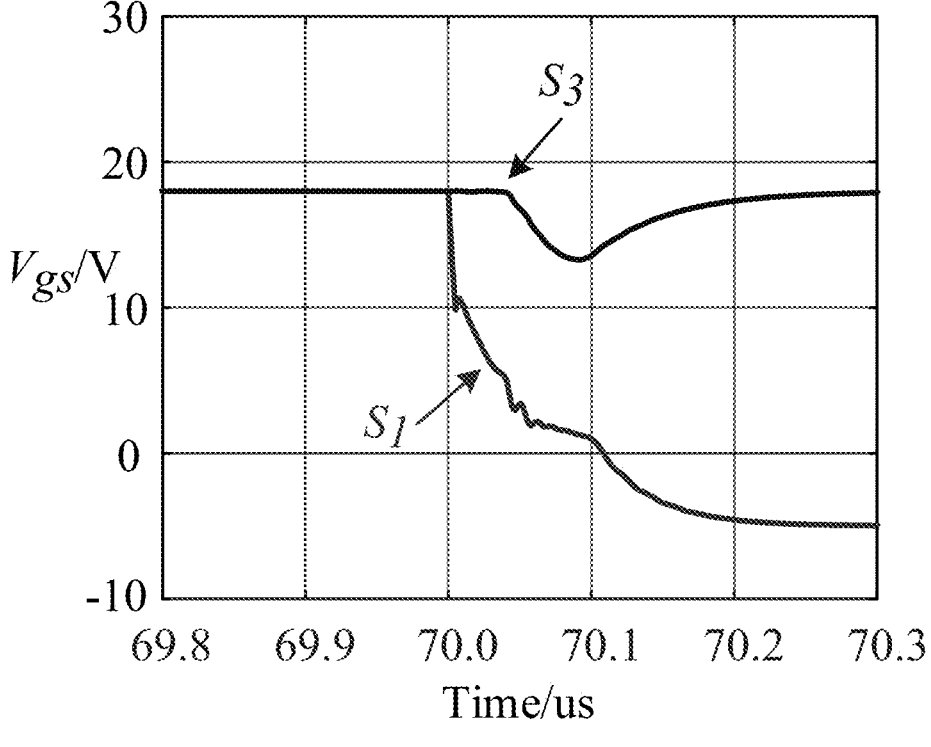
FIG. 11 is the gate-source voltage waveforms of MOSFETs in the first switching transistor and the third switching transistor when the first switching transistor is turned off.

In the circuit of the current-source type double-pulse test: the theoretical working waveform of the current-source type double-pulse test is shown in FIG. 3, the overlapping switching time is set in the current-source inverter to avoid open-circuit fault, and when $S_1$ is turned on, whether $S_3$ is on or off will not affect the entire double-pulse test. Therefore, for the purpose of simplification, $S_3$ will be long on. Thus, analysis may be performed in five periods:

(1) $t_0$-$t_0$: in this period, $S_1$ and $S_3$ are both in the on-state, the current $I_{dc}$ directly flows through the first switching transistor, and the voltage on the capacitor C is zero;

(2) $t_0$-$t_1$: in this period, $S_1$ is turned off, the current $I_{dc}$ flows through the third switching transistor to charge the capacitor C, and the voltage on the capacitor may be calculated through the principle of ampere-second equilibrium, i.e., formula (1)

$$V_c = \frac{I_{dc} \cdot T_1}{C} \tag{1}$$

(3) $t_1$-$t_2$: in this period, $S_1$ is turned on, the current $I_{dc}$ changes from the third switching transistor to the first switching transistor, the voltage on the capacitor C maintains unchanged, simulating that the three-phase current-source inverter is switched from the active vector to the zero vector. Since $S_3$ is long on, the voltage on the Schottky diode $D_3$ suddenly changes from the turn-on voltage to $-V_c$;

(4) $t_2$-$t_3$: in this period, $S_1$ is turned off, the current $I_{dc}$ flows through the third switching transistor to further charge the capacitor C, simulating that the three-phase current-source inverter is switched from the zero vector to the active vector.

(5) $t_3$-$t_4$: in this period, $S_1$ is turned on again, and the capacitor C stops being charged.

On this basis, in the simulation model of the mechanism analysis method for the crosstalk in half-bridge of current-source inverter, the SiC MOSFET is employed as CREE C3M0040120D, and the SiC Schottky diode is employed as onsemi FFSH5065A. When the first switching transistor is turned on, the voltage waveform of the MOSFET in the first switching transistor, the waveform of the current flowing through the first switching transistor and the waveform of the current flowing through the third switching transistor, the voltage waveform of the Schottky diode in the third switching transistor, and the gate-source voltage waveforms of the MOSFETs in the first switching transistor and the third switching transistor are as shown in FIGS. 4 to 7 respectively.

During this process, the current flowing through the third switching transistor falls from $I_{dc}$ to zero, and is coupled with the common source inductance of the MOSFET in the third switching transistor, resulting in an induced voltage with negative top end and positive bottom end, such that the gate-source junction capacitor is positively charged to cause forward crosstalk. After the current flowing through the third switching transistor crosses zero, the voltage on the Schottky diode in the third switching transistor drops suddenly from the turn-on voltage to $-V_c$. The change in voltage is coupled with the junction capacitance on the diode to generate reverse recovery current. Since the MOSFET and the diode are connected in series, the peak value of the forward crosstalk voltage will be further increased. When the first switching transistor is turned off, the voltage waveform of the MOSFET in the first switching transistor, the waveform of the current flowing through the first switching transistor and the waveform of the current flowing through the third switching transistor, the voltage waveform of the Schottky diode in the third switching transistor, and gate-source voltage waveforms of MOSFETs in the first switching transistor and the third switching transistor are as shown in FIGS. 8 to 11 respectively.

During this process, the current flowing through the third switching transistor rises from zero to $I_{dc}$, and is coupled with the common source inductance of the MOSFET in the third switching transistor, resulting in an induced voltage with positive top end and negative bottom end, which charges gate-source junction capacitor in the opposite direction, causing reverse crosstalk.

Figure 12:
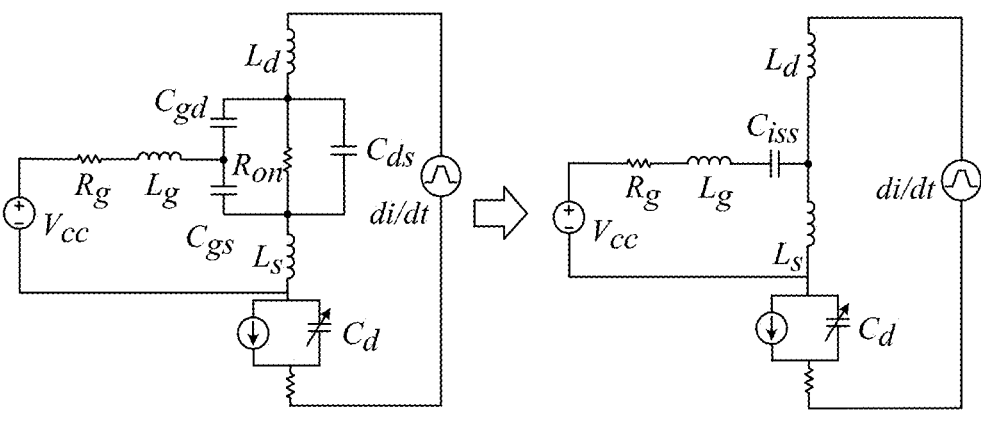
FIG. 12 is an equivalent circuit diagram of current-source type double-pulse test when crosstalk occurs.

In the equivalent circuit of the current-source type double-pulse test when crosstalk occurs, by using di dt as the main crosstalk excitation source, considering that $S_3$ is in the long-turned-on state, and is equivalent to a turn-on resistor, and thus, the crosstalk voltage spike is analyzed and calculated. In order to further simplify the calculation steps, the turn-on resistor is approximately equal to 0, and its equivalent circuit is shown in FIG. 12.

On this basis, the complex frequency domain analysis is carried out on the equivalent circuit. The function of di/dt may be simply regarded as a slope function, that is, $I_{dc}(t)=kt$ in this period, where k=di/dt. The junction capacitor $C_{iss}$ is charged when the crosstalk occurs, and the initial state of the voltage on $C_{iss}$ can be approximately regarded as positive driving voltage $V_{cc}$. Therefore, according to the Laplace transform, the voltage variation $\Delta V_{gs}(s)$ at the gate-source junction of MOSFET when the crosstalk occurs can be expressed as:

$$\Delta V_{gs}(s) = \begin{cases} \frac{I_0}{t} L_s \cdot \left[ \frac{1}{s} - \frac{s+2\alpha}{(s+\alpha)^2 + \omega^2} \right], & R_g^2 < \frac{4(L_s + L_g)}{C_{iss}} \\ \frac{I_0}{t} L_s \cdot \left[ \frac{1}{s} - \frac{s+2\alpha}{(s+\alpha)} \right], & R_g^2 = \frac{4(L_s + L_g)}{C_{iss}} \\ \frac{I_0}{t} L_s \cdot \left[ \frac{1}{s} - \frac{s+2\alpha}{(s+\alpha)^2 - \omega^2} \right], & R_g^2 > \frac{4(L_s + L_g)}{C_{iss}} \end{cases} \tag{2}$$

In the formula, t is the time for the current to rise and fall during the switching process, which is obtained by solving the differential equation of the drive loop in the process of the drive voltage rising from threshold voltage to Miller plateau voltage, and can be expressed as:

$$t = -\left( R_g C_{gs} + \frac{g_m}{x} L_s \right) ln\left( \frac{V_{miller} - V_{cc}}{V_{th} - V_{cc}} \right),$$

$$\omega = \begin{cases} \sqrt{\frac{1}{C_{iss} \cdot (L_s + L_g)} - \frac{R_g^2}{4(L_s + L_g)^2}}, & R_g^2 < \frac{4(L_s + L_g)}{C_{iss}} \\ 0, & R_g^2 = \frac{4(L_s + L_g)}{C_{iss}} \\ \sqrt{\frac{R_g^2}{4(L_s + L_g)^2} - \frac{1}{C_{iss} \cdot (L_s + L_g)}}, & R_g^2 > \frac{4(L_s + L_g)}{C_{iss}} \end{cases},$$

$$\alpha = \frac{R_g}{2(L_g + L_s)},$$

$I_0$ is load current flowing through the device, $C_{gs}$ is the gate-source junction capacitance of the device affected by crosstalk, $g_m$ is transconductance of device, x is the fitting coefficient in the transfer characteristic curve of the device, i.e., $i_{ch}=k_1(V_{gs}-V_{th})^x+k_2$, $V_{th}$ is threshold voltage of device, $V_{miller}$ is the Miller plateau voltage, $V_{cc}$ is the positive driving voltage, $R_g$ and $L_g$ are respectively the gate resistance of the disturbed device and the stray inductance of the drive loop in the equivalent circuit of the current-source type double-pulse test when crosstalk occurs, $C_{iss}$ is the input capacitance of the device affected by crosstalk, which is the sum of gate-drain junction capacitance and gate-source junction capacitance, and $L_s$ is the sum of the internal common source inductance of the device affected by crosstalk and stray inductance of PCB.

The time for the current to rise and fall during the switching process is corrected on the basis of the conventional formula. Generally, the current rise and fall of the SiC MOSFET is regarded as a linear change process, which is approximately expressed with $I_0=g_m(V_{gs}-V_{th})$. It can be seen from the derivation of the fitting expression of the device transfer characteristics, if $g_m=k_1 \cdot x(V_{gs}-V_{th})^{x-1}$ is substituted back into the approximate expression, a deviation of X times will be caused, resulting in inaccurate theoretical calculation. Similarly, the Miller plateau voltage is calculated and corrected to $$V_{miller} = \frac{x(I_0 - k_2)}{g_m} + V_{th}.$$

A time-domain expression $\Delta V_{gs}(t)$ of the voltage variation of the gate-source junction of the MOSFET when crosstalk occurs is:

$$\Delta V_{gs}(t) = \tag{3}$$

$$\begin{cases} \frac{I_0}{t}L_s \cdot \left[1 - e^{-\alpha t} \cdot \cos(\omega t) - \frac{\alpha}{\omega} \cdot e^{-\alpha t} \cdot \sin(\omega t)\right], & R_g^2 < \frac{4(L_s + L_g)}{C_{iss}} \\ \frac{I_0}{t}L_s \cdot (1 - e^{-\alpha t} - \alpha t e^{-\alpha t}), & R_g^2 = \frac{4(L_s + L_g)}{C_{iss}} \\ \frac{I_0}{t}L_s \cdot \left(1 - e^{-\alpha t} \cdot \cosh(\omega t) - \frac{\alpha}{\omega} \cdot e^{-\alpha t} \cdot \sinh(\omega t)\right), & R_g^2 > \frac{4(L_s + L_g)}{C_{iss}} \end{cases}$$

Figure 13:
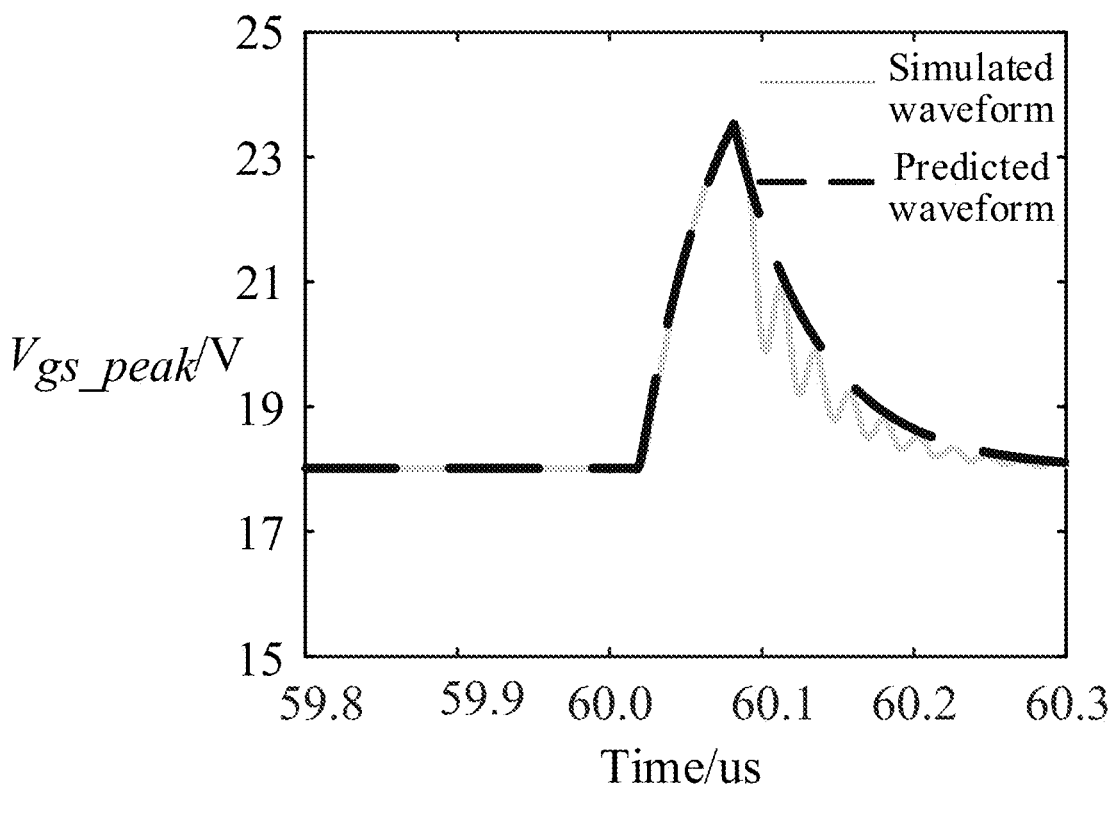
FIG. 13 is a comparison diagram of crosstalk voltage spike between the prediction model and simulated waveform.

According to the above derivation, the prediction system adopts the relevant parameters of CREE C3M0040120D for the analysis and calculation. FIG. 13 shows a comparison between the predicted waveform and the simulated waveform when the current is 50 A, positive driving voltage is 18 V, and the gate resistance is 10Ω by employing the aforementioned theoretical model. It can be seen from the figure that the predicted waveform can follow the simulated waveform very accurately.

Figure 14:
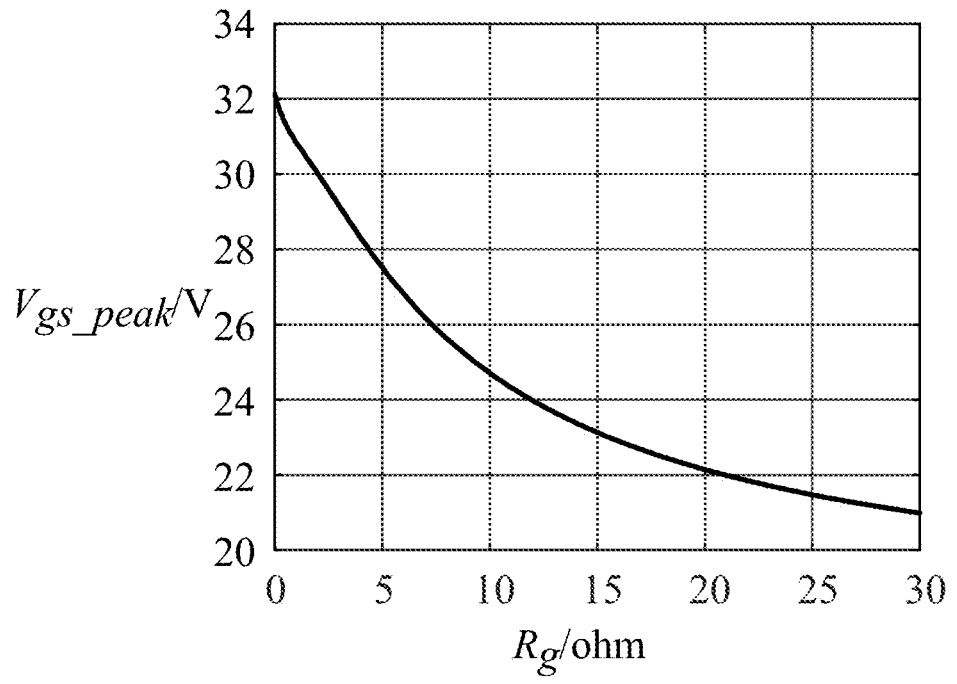
FIG. 14 is a relationship diagram between the extreme value of the crosstalk spike in half-bridge of the current-source inverter and gate resistance when the first switching transistor is turned off.
Figure 15:
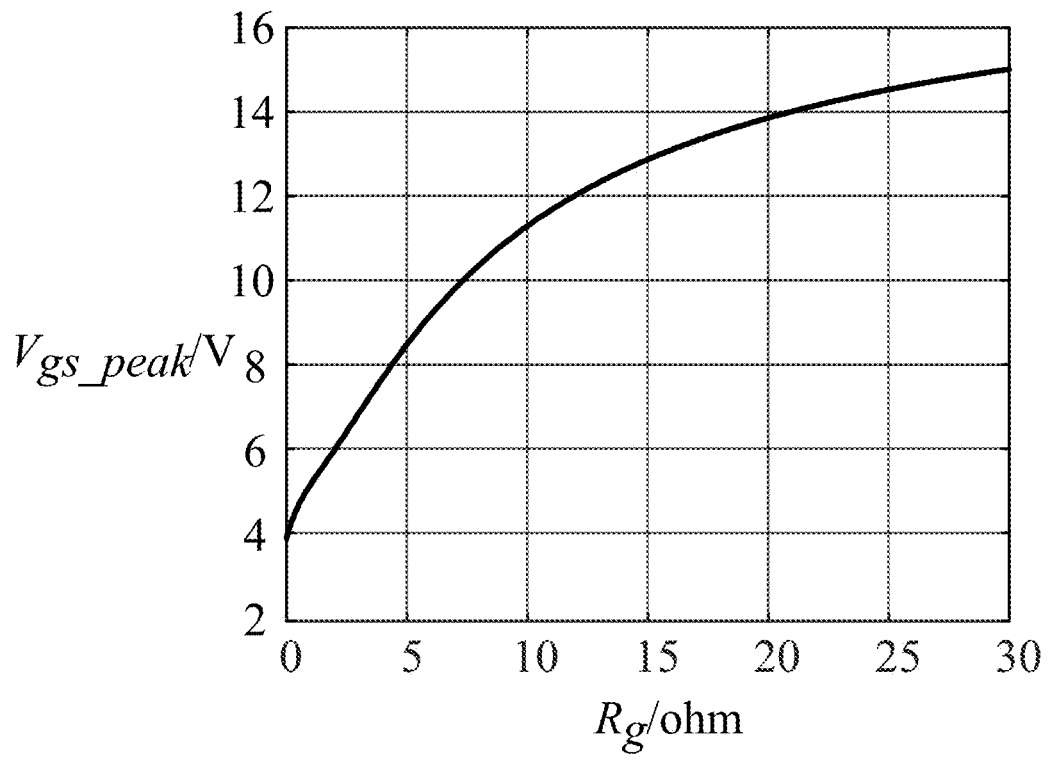

FIGS. 14 and 15 show the relationship between the extreme value of the crosstalk spike in half-bridge of current-source inverter and gate resistance when the first switching transistor is turned off and turned on. It can be seen from the figure that the higher the gate resistance is, the smaller the forward and reverse crosstalk spike values; however, the increase of gate resistance will slow down the switching process of the device, resulting in the increase of switching loss. Therefore, a trade-off needs to be made when selecting the gate driver resistance.

Figure 16:
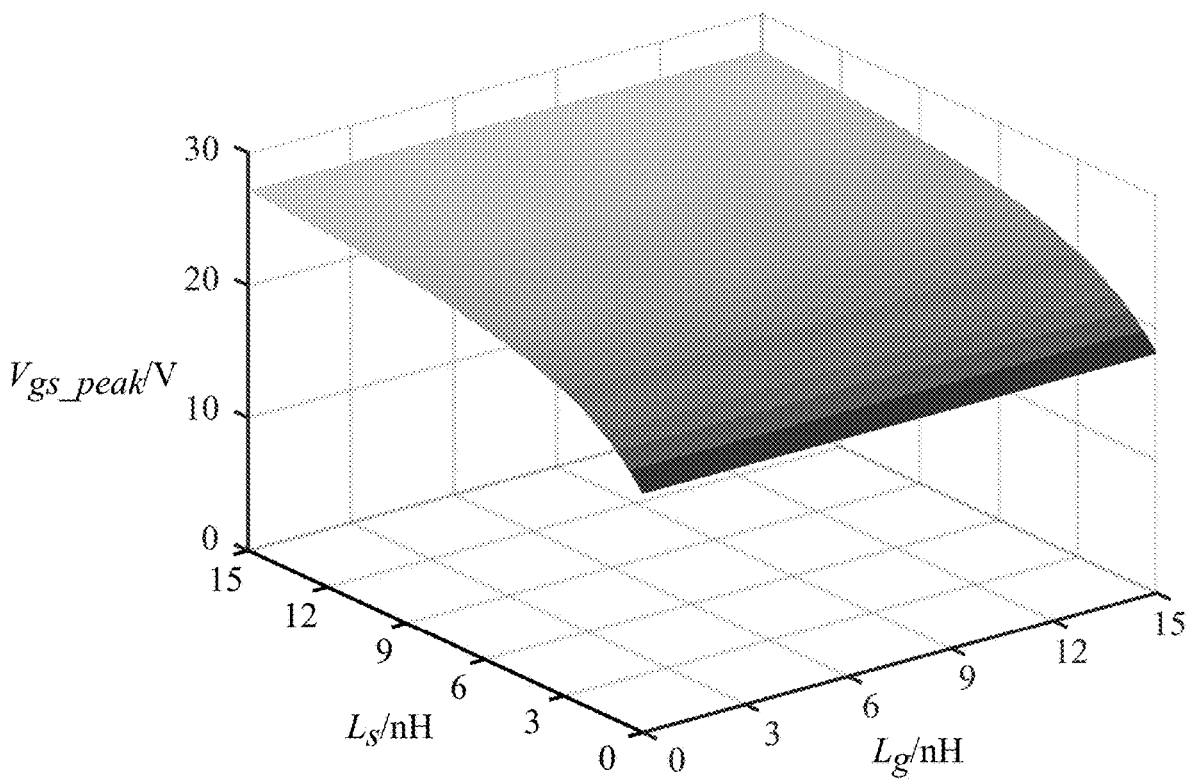
FIG. 16 is a relationship diagram between the extreme value of the crosstalk spike in half-bridge of the current-source inverter, common source inductance, and stray inductance in driver loop when the first switching transistor is turned off.
Figure 17:
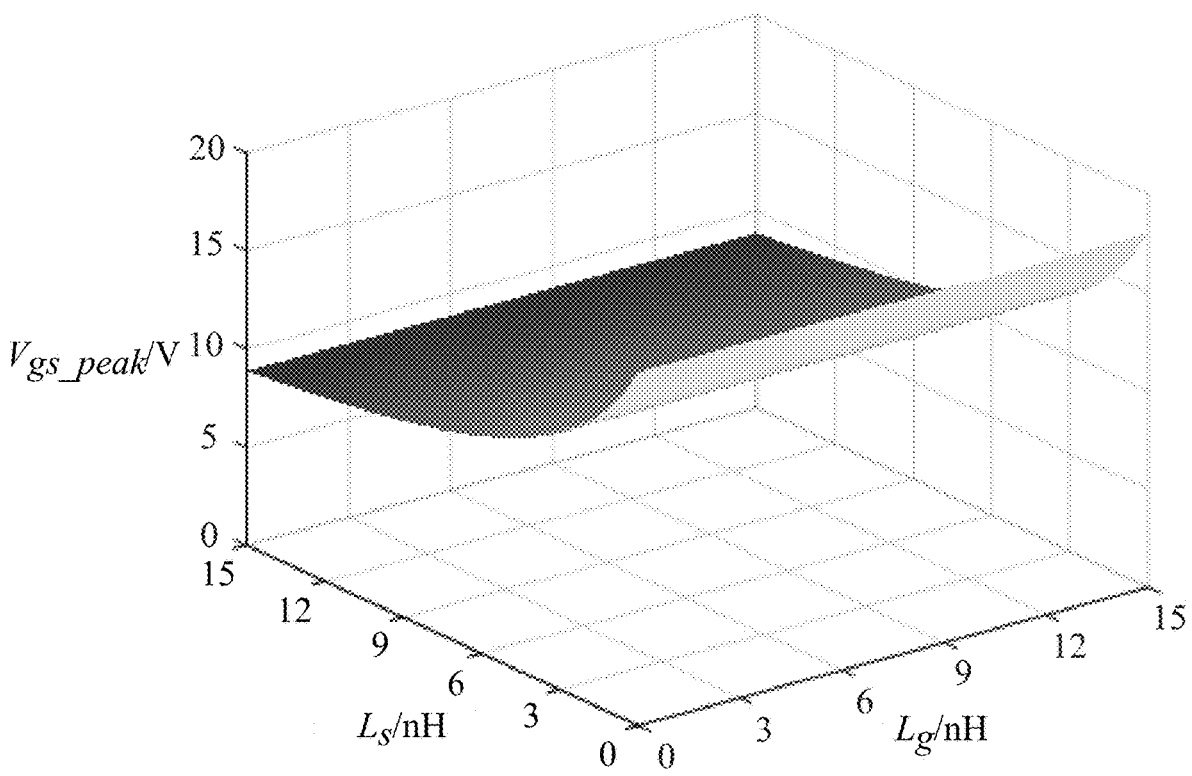
Figure 18:
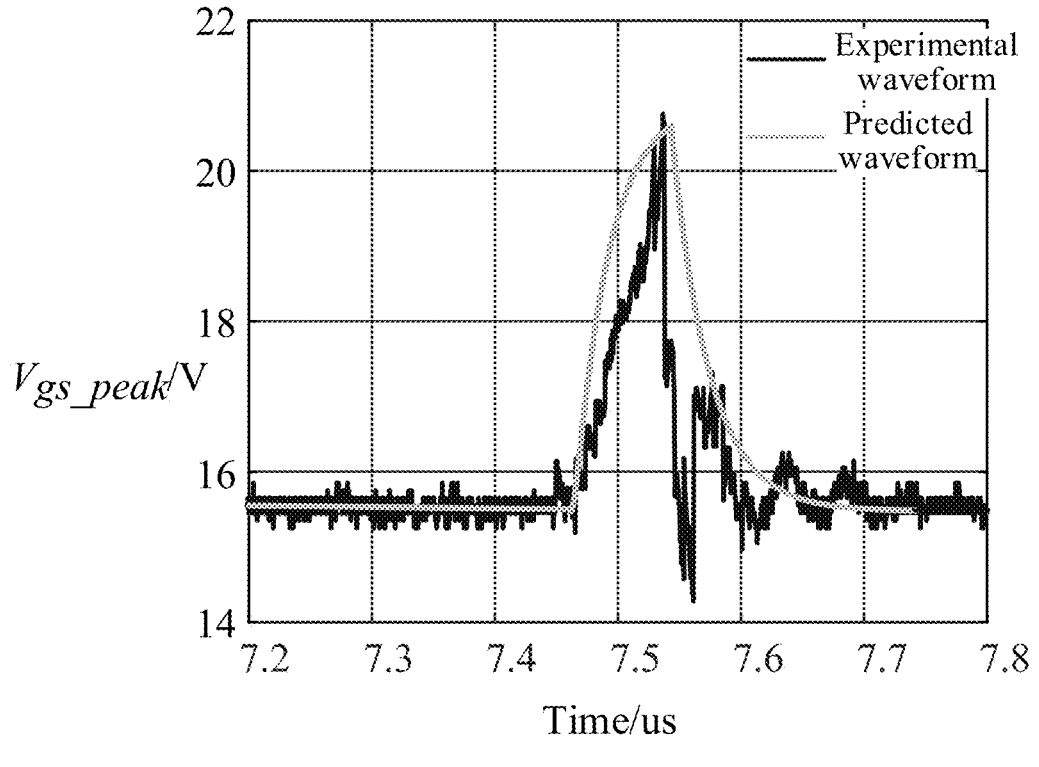
FIG. 18 is the experimentally extracted waveform and the theoretically predicted waveform of the crosstalk voltage spike on the third switching transistor at gate resistance of $5\Omega$ when the first switching transistor is turned on at the gate resistance of 20 $\Omega$.
Figure 19:
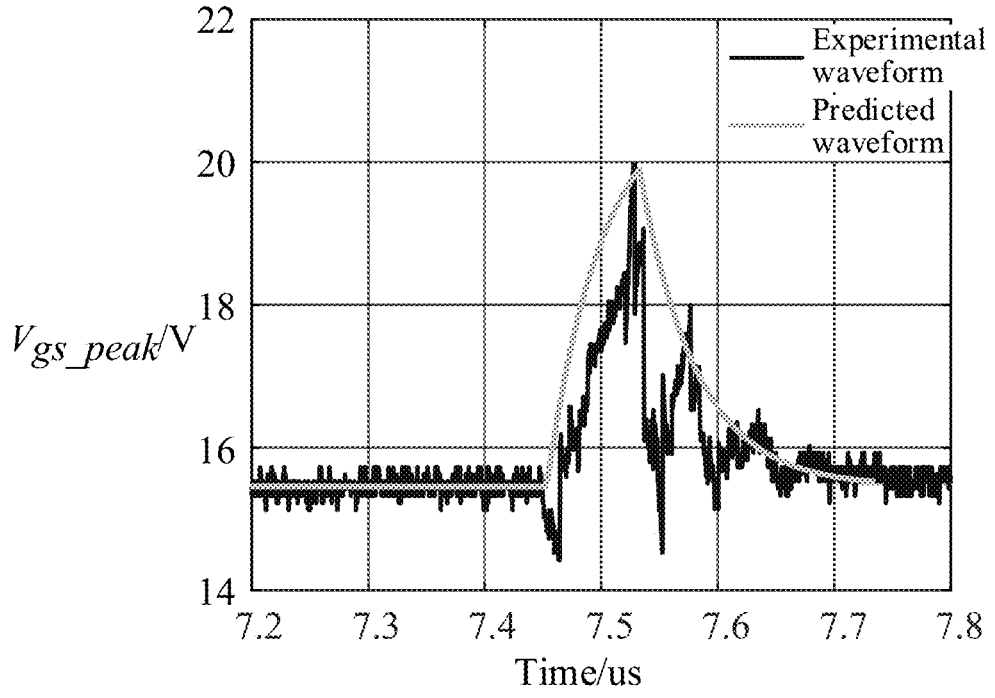
FIG. 19 is the experimentally extracted waveform and the theoretically predicted waveform of the crosstalk voltage spike on the third switching transistor at gate resistance of $10\Omega$ when the first switching transistor is turned on at the gate resistance of 20 $\Omega$.
Figure 20:
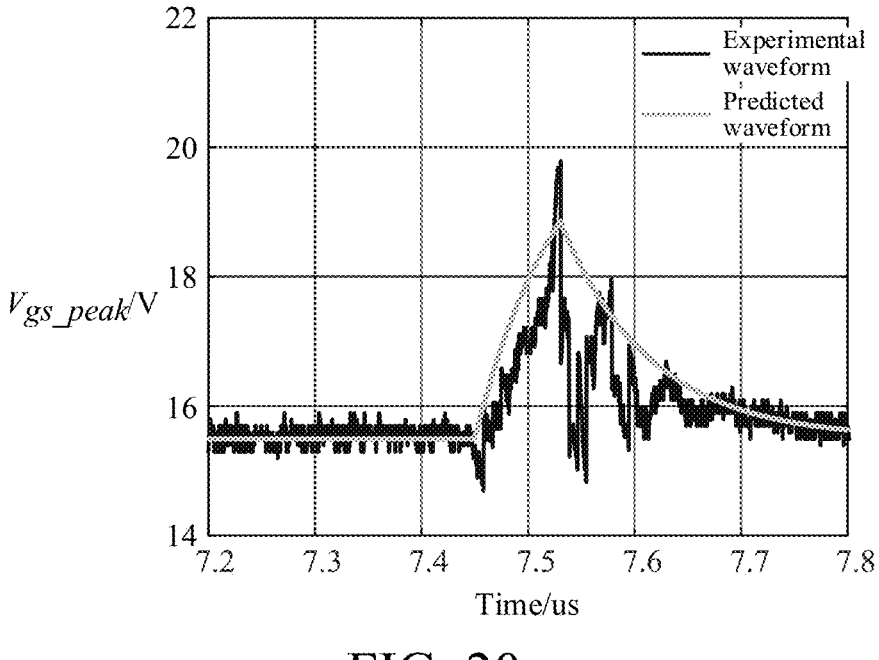
FIG. 20 is the experimentally extracted waveform and the theoretically predicted waveform of the crosstalk voltage spike on the third switching transistor at gate resistance of $20\Omega$ when the first switching transistor is turned on at the gate resistance of 20 $\Omega$.
Figure 21:
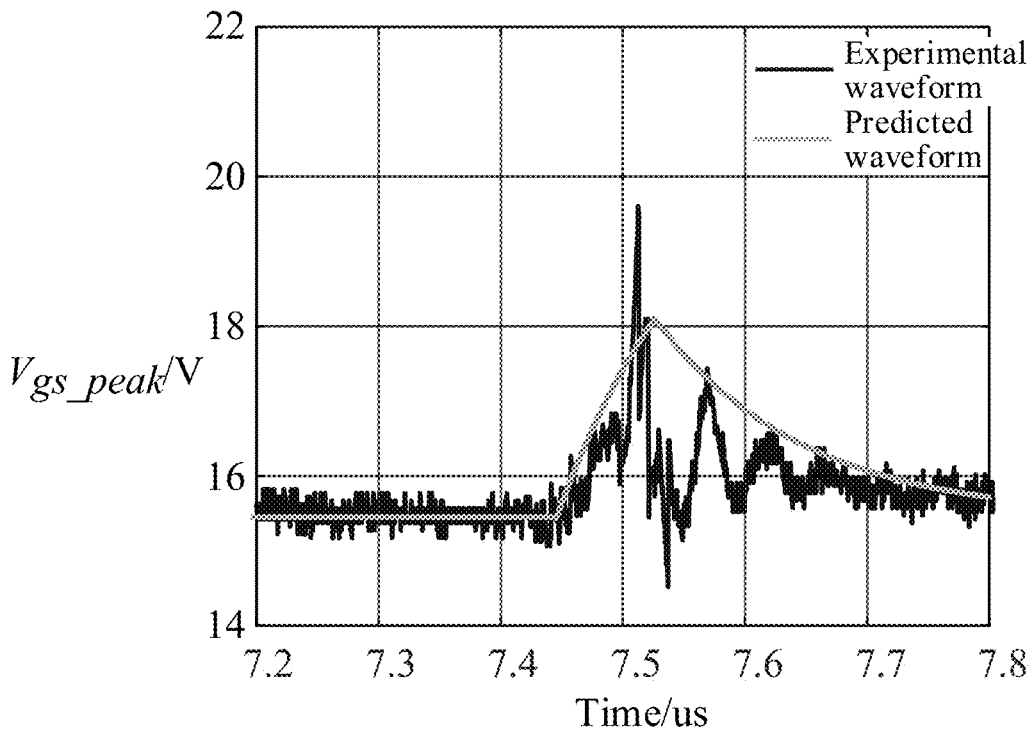
FIG. 21 is the experimentally extracted waveform and the theoretically predicted waveform of the crosstalk voltage spike on the third switching transistor at gate resistance of $30\Omega$ when the first switching transistor is turned on at the gate resistance of 20 $\Omega$.

FIGS. 16 and 17 show the relationship between the extreme value of the crosstalk spike in half-bridge of current-source inverter and common source inductance, and stray inductance in drive loop when the first switching transistor is turned off and turned on. It can be seen from the figure that the stray inductance of the drive loop has a small impact on the crosstalk phenomenon in half-bridge of current-source inverter, while the influence from the common source parasitic inductance is dominant among all the factors on the crosstalk phenomenon in half-bridge of current-source inverter.

FIGS. 18 to 21 respectively show the experimental waveforms and the theoretical predicted waveforms of the crosstalk voltage spike received by the third switching transistor under different gate resistance when the first switching transistor is turned on. In the experiment, the positive driving voltage is 15.5 V, the load current of the switching transistor is 40 A during switching, the gate resistance of the first switching transistor is set to 20Ω, and the drive resistance of the third switching transistor is set to 5 Ω, 10 Ω, 20Ω and 30Ω. Both the experimental waveforms and the theoretical predicted waveforms reflect that the crosstalk voltage spike decreases with the increase of the gate resistance, which is consistent with the change trend analyzed in FIG. 14. An error between the crosstalk spike and the prediction spike in the experimental waveforms mainly comes from the measurement error and the discrete data calculation error when removing the induced voltage on the common source stray inductor $L_s$.

When di/dt is constant, the smaller the gate resistance of the third switching transistor, the larger the crosstalk spike the third switching transistor bears. The larger the common source inductance, the larger the crosstalk spike the third switching transistor bears. The larger the junction capacitance of series diode, the faster change in the voltage on the diode in third switching transistor the turn-on of the first switching transistor leads to, and the larger the reverse recovery current generated by coupling with the junction capacitance, so that the current flowing through the third switching transistor has a larger value of the reverse over-zero, and the more pronounced the diode's reverse recovery process is, which results in the third switching transistor being subjected to a larger forward crosstalk spike.

In the descriptions of this specification, a description of a reference term such as "an embodiment", "an example", or "a specific example" means that a specific feature, structure, material, or characteristic that is described with reference to the embodiment or the example is included in at least one embodiment or example of the present invention. In this specification, exemplary descriptions of the foregoing terms do not necessarily refer to the same embodiment or example. Moreover, the described specific features, structures, materials, or characteristics may be combined in a proper manner in any one or more of the embodiments or examples.

Basic principles, main features of the present invention and advantages of the present invention are shown and described above. A person skilled in the art may understand that the present invention is not limited to the foregoing embodiments. Descriptions in the embodiments and this specification only illustrate the principles of the present invention. Various modifications and improvements are made in the present invention without departing from the spirit and the scope of the present invention, and these modifications and improvements shall fall within the protection scope of the present invention.

What is claimed is:

1. A prediction method for a crosstalk voltage spike in a half-bridge of a current-source inverter with silicon carbide devices, comprising:

calculating the crosstalk voltage spike in a circuit of current-source type double-pulse test and analyzing an effect of influencing factors on a magnitude of the crosstalk voltage spike;

in the circuit of the current-source type double-pulse test, connecting first and second reverse-voltage-blocking synthesis devices, the first consisting of a metal-oxide-semiconductor field-effect transistor (MOSFET) $S_1$ and a Schottky diode $D_1$ connected in series, and the second consisting of a MOSFET $S_3$ and a Schottky diode $D_3$ connected in series, to both ends of a capacitor, wherein the capacitor is equivalent to a filter capacitor on an AC side of a three-phase current-source inverter, forming an arm bridge of the current-source inverter, which is configured to simulate a switching process of the three-phase current-source inverter;

wherein in the calculation of the crosstalk voltage spike, a maximum value of the calculated crosstalk voltage spike in the half-bridge of the current-source inverter is calculated by:

$$\Delta V_{gs}(t) =$$

$$\begin{cases} \frac{I_0}{t}L_s \cdot \left[1 - e^{-\alpha t} \cdot \cos(\omega t) - \frac{\alpha}{\omega} \cdot e^{-\alpha t} \cdot \sin(\omega t)\right], & R_g^2 < \frac{4(L_s + L_g)}{C_{iss}} \\ \frac{I_0}{t}L_s \cdot (1 - e^{-\alpha t} - \alpha t e^{-\alpha t}), & R_g^2 = \frac{4(L_s + L_g)}{C_{iss}} \\ \frac{I_0}{t}L_s \cdot \left(1 - e^{-\alpha t} \cdot \cosh(\omega t) - \frac{\alpha}{\omega} \cdot e^{-\alpha t} \cdot \sinh(\omega t)\right], & R_g^2 > \frac{4(L_s + L_g)}{C_{iss}} \end{cases}$$

where t is time when current rises and falls during the switching process, expressed as:

$$t = -\left(R_g C_{gs} + \frac{g_m}{x}L_s\right) ln\left(\frac{V_{miller} - V_{cc}}{V_{th} - V_{cc}}\right),$$

$$\omega = \begin{cases} \sqrt{\frac{1}{C_{iss} \cdot (L_s + L_g)} - \frac{R_g^2}{4(L_s + L_g)^2}}, & R_g^2 < \frac{4(L_s + L_g)}{C_{iss}} \\ 0, & R_g^2 = \frac{4(L_s + L_g)}{C_{iss}} \\ \sqrt{\frac{R_g^2}{4(L_s + L_g)^2} - \frac{1}{C_{iss} \cdot (L_s + L_g)}}, & R_g^2 > \frac{4(L_s + L_g)}{C_{iss}} \end{cases}$$

$$\alpha = \frac{R_g}{2(L_g + L_s)},$$

$I_0$ is load current flowing through the reverse-voltage-blocking synthesis devices, $C_{gs}$ is a gate-source junction capacitance of the second reverse-voltage-blocking synthesis device affected by crosstalk, $g_m$ is transconductance of the second reverse-voltage-blocking synthesis device, x is a fitting coefficient in a transfer characteristic curve of the second reverse-voltage-blocking synthesis device, $V_{th}$ is a threshold voltage of the second reverse-voltage-blocking synthesis device, $V_{miller}$ is a Miller plateau voltage, $V_{cc}$ is a positive driving voltage, $R_g$ and $L_g$ are respectively a gate resistance of a disturbed device and a stray inductance of a drive loop in an equivalent circuit of the current-source type double-pulse test when crosstalk occurs, $C_{iss}$ is an input capacitance of the second reverse-voltage-blocking synthesis device affected by crosstalk, which is a sum of a gate-drain junction capacitance and a gate-source junction capacitance, and $L_s$ is a sum of an internal common source inductance of the second reverse-voltage-blocking synthesis device affected by the crosstalk and stray inductance of a printed circuit board (PCB);

wherein the influencing factors for the crosstalk voltage spike include a value of the gate resistance, a value of the internal common source inductance and a value of junction capacitance of the Schottky diode of the second reverse-voltage-blocking synthesis device; when di/dt is constant, the smaller the gate resistance of a switching transistor of the second reverse-voltage-blocking synthesis device is, the larger the crosstalk voltage spike the device bears; the larger the common source inductance is, the larger the crosstalk voltage spike the switching transistor of the second reverse-voltage-blocking synthesis device bears; and the larger the junction capacitance of the Schottky diode is, the faster a change in the voltage on the diode in the switching transistor of the second reverse-voltage-blocking synthesis device is, the faster the turn-on of a switching transistor of the first reverse-voltage-blocking synthesis device is, and the larger a reverse recovery current generated by coupling with the junction capacitance is, so that the current flowing through the switching transistor of the second reverse-voltage-blocking synthesis device has a larger value of the reverse over-zero, and the more pronounced a reverse recovery process of the diode is, which results in the switching transistor of the second reverse-voltage-blocking synthesis device being subjected to a larger forward crosstalk voltage spike.

2. The prediction method for the crosstalk voltage spike in the half-bridge of the current-source inverter with silicon carbide devices according to claim 1, wherein the circuit of the current-source type double-pulse test fully considers parasitic parameters and stray parameters in the device and the circuit, comprising the junction capacitance and stray inductance of the MOSFET and the stray inductance of the drive loop, where $R_{g1}$ and $R_{g3}$ are the sum of drive resistance and the internal gate resistance of the MOSFET, $L_{d1}$ and $L_{d3}$ are the sum of drain parasitic inductance of the MOSFET and the stray inductance of printed circuit board (PCB), and $L_{s1}$ and $L_{s3}$ are the sum of common source parasitic inductance of the MOSFET and the stray inductance of PCB.

3. The prediction method for the crosstalk voltage spike in the half-bridge of current-source inverter with silicon carbide devices according to claim 2, wherein the third switching transistor of the current-source type double-pulse test circuit is in a long-turn-on state, which is divided into two modes according to turn-on and turn-off of the switching transistor of the first reverse-voltage-blocking synthesis device; when the switching transistor of the first reverse-voltage-blocking synthesis device is turned off, the current source charges the capacitor through the switching transistor of the second reverse-voltage-blocking synthesis device, simulating an active vector of three-phase current-source inverter; when the switching transistor of the first reverse-voltage-blocking synthesis device is turned on, current is switched from the third switching transistor of the second reverse-voltage-blocking synthesis device to the switching transistor of the first reverse-voltage-blocking synthesis device, and the voltage on the capacitor is unchanged during this process, simulating a zero vector of the three-phase current-source inverter;

the long-turn-on state of the third switching transistor simulates overlapping turn-on time of the three-phase current-source inverter during switching to avoid open-circuit fault.

4. The prediction method for the crosstalk voltage spike in the half-bridge of the current-source inverter with silicon carbide devices according to claim 3, wherein a crosstalk conduction direction in the half-bridge of the current-source inverter is horizontal;

the second reverse-voltage-blocking synthesis device bears forward crosstalk when the first reverse-voltage-blocking synthesis device is turned on, and bears reverse crosstalk when the first reverse-voltage-blocking synthesis device is turned off, which is opposite to the crosstalk in the half-bridge also caused by di/dt in the voltage-source inverter;

the crosstalk in the half-bridge of the current-source inverter only occurs when the gate-source voltage of the second reverse-voltage-blocking synthesis device is a positive driving voltage, while the crosstalk in the half-bridge of the voltage-source inverter only occurs when the gate-source voltage of the second reverse-voltage-blocking synthesis device is a negative driving voltage.

5. The prediction method for the crosstalk voltage spike in the half-bridge of the current-source inverter with silicon carbide devices according to claim 4, further comprising taking the di/dt caused by the switching of the first switching transistor as excitation, considering the overlapping conduction of the device, the MOSFET in the switching transistor of the second reverse-voltage-blocking synthesis device is equivalent to a resistor, the value of which is the turn-on resistance value of the device, and the gate-drain junction capacitance value is the value when the drain-source voltage is close to 0, without considering the influence caused by a nonlinear change in switching conditions of the device.

6. The prediction method for the crosstalk voltage spike in the half-bridge of the current-source inverter with silicon carbide devices according to claim 1, wherein the calculation of the Miller plateau voltage is corrected to $$V_{miller} = \frac{x(I_0 - k_2)}{g_m} + V_{th}$$

on a basis of a conventional calculation method.

\* \* \* \* \*